(12) United States Patent
Morimoto et al.

(10) Patent No.: US 8,442,459 B2
(45) Date of Patent: May 14, 2013

(54) TRANSMITTER AND COMMUNICATION APPARATUS USING THE SAME

(75) Inventors: Shigeru Morimoto, Osaka (JP); Ryo Kitamura, Osaka (JP)

(73) Assignee: Panasonic Corporation, Osaka (JP)

( * ) Notice: Subject to any disclaimer, the term of this patent is extended or adjusted under 35 U.S.C. 154(b) by 397 days.

(21) Appl. No.: 12/493,496

(22) Filed: Jun. 29, 2009

(65) Prior Publication Data

US 2010/0003932 A1    Jan. 7, 2010

(30) Foreign Application Priority Data

Jun. 30, 2008  (JP) ................................ 2008-171582

(51) Int. Cl.
*H04B 1/66*    (2006.01)

(52) U.S. Cl.
USPC ............................ 455/102; 455/110; 455/108

(58) Field of Classification Search .... 455/102; 330/308
See application file for complete search history.

(56) References Cited

U.S. PATENT DOCUMENTS

| | | | |
|---|---|---|---|
| 6,256,482 B1 * | 7/2001 | Raab | 455/108 |
| 7,444,122 B2 * | 10/2008 | Wu et al. | 455/119 |
| 7,705,672 B1 * | 4/2010 | Rodriguez | 330/10 |
| 2007/0254622 A1 * | 11/2007 | Matsuura et al. | 455/403 |
| 2009/0085689 A1 * | 4/2009 | Rohani et al. | 333/25 |
| 2009/0161793 A1 * | 6/2009 | Nentwig | 375/297 |

FOREIGN PATENT DOCUMENTS

JP    2003-143060    5/2003

* cited by examiner

*Primary Examiner* — Yuwen Pan
*Assistant Examiner* — Fatuma Sherif
(74) *Attorney, Agent, or Firm* — Wenderoth, Lind & Ponack, L.L.P.

(57) ABSTRACT

A signal generating section 10 outputs an amplitude signal and a frequency signal by conducting a signal processing on inputted data. A regulator 31 outputs a signal that is proportional to a magnitude of the amplitude signal. The signal outputted from the regulator 31 passes through a low pass filter 41, and is inputted into a power amplifier 51. The power amplifier 51 conducts an amplitude modulation on a frequency signal on which an angle modulation is conducted by an angle modulation section 20, using a signal outputted from the low pass filter 41. A controlling section 60 controls an amount of attenuation of a radio frequency component at the low pass filter 41 based on information such as: a modulation method of the inputted data; a modulation condition of the inputted data; a reception band; an output power of a modulation signal; and a frequency of the modulation signal.

6 Claims, 8 Drawing Sheets

F I G. 4

| MODULATION METHOD · RECEPTION BAND | SWITCH SELECTION |
|---|---|
| G S M | C 3 |
| U M T S (Band V) | C 2 |
| U M T S (Band II) | C 1 |

FIG. 7

| MODULATION METHOD · RECEPTION BAND | SWITCH SELECTION | AMOUNT OF DELAY [n s] |
|---|---|---|
| GSM | C 3 | 2 0. 0 |
| UMTS (Band V) | C 2 | 1. 5 |
| UMTS (Band II) | C 1 | 2. 0 |

TRANSMITTER AND COMMUNICATION APPARATUS USING THE SAME

BACKGROUND OF THE INVENTION

1. Field of the Invention

The present invention relates to: a transmitter that generates a transmission signal by using a polar modulation method; and a communication apparatus that uses the transmitter.

2. Description of the Background Art

Conventionally, a class A or a class AB linear amplifier is used as a radio frequency power amplifier for amplifying a modulation signal that includes an envelope curve fluctuation component, in order to linearly amplify the envelope curve fluctuation component. Although such linear amplifier has excellent linearity, they have lower power efficiency compared to a class C or a class E non-linear amplifier, and the like, since they constantly consume electrical power that is associated with a direct current bias component. Therefore, when such a radio frequency power amplifier is applied in a portable communication apparatus that uses a battery as a power supply, there is problem in that possible usage time of the portable communication apparatus becomes short since an amount of power consumption of the radio frequency power amplifier is large. Moreover, when such a radio frequency power amplifier is applied in a base station apparatus having a wireless system in which a plurality of high power transmitters are installed; problems, such as requirement of larger size of an apparatus and increase in the amount of heat released, arise as a result.

In order to solve the above-described problem, a transmitter that uses a polar modulation method has been conventionally suggested as a transmitter that operates with high efficiency. FIG. 9 is a block diagram showing a configuration of a conventional transmitter 500 that uses a polar modulation method. In FIG. 9, the conventional transmitter 500 includes: a signal generating section 510; an angle modulation section 520; an amplitude amplification section 530; and an amplitude modulation section 550.

The signal generating section 510 outputs an amplitude signal and a frequency signal, based on an amplitude component and a phase component, which are obtained by conducting a signal processing on inputted data. The frequency signal is a signal obtained by performing differentiation on the phase with respect to time. The amplitude signal is inputted into the amplitude amplification section 530, and the frequency signal is inputted into the angle modulation section 520. The amplitude amplification section 530 supplies the amplitude modulation section 550 with a voltage in response to the inputted amplitude signal. The angle modulation section 520: conducts an angle modulation on the inputted frequency signal; generates an angle modulation signal; and outputs the angle modulation signal to the amplitude modulation section 550. The amplitude modulation section 550 conducts an amplitude modulation on the angle modulation signal outputted by the angle modulation section 520 by using the voltage supplied by the amplitude amplification section 530; and outputs the resulting signal as a modulation signal. This modulation signal is outputted as a transmission signal.

As described above, the conventional transmitter 500 that uses the polar modulation method attains a transmitter having high efficiency and low distortion by processing the amplitude signal and the frequency signal individually.

It is difficult for the transmitter that uses the above described polar modulation method to achieve both requirements of suppression of a reception band noise and suppression of a modulation distortion, since a modulated wave has a broadened bandwidth. In particular, in a multiband-multimode radio, an interval between a reception frequency and a transmission frequency, and demanded specifications, are different in every band mode. With the transmitter that uses the polar modulation method, a noise at an amplitude amplification section, which is not a problem when an orthogonal modulation method is used, becomes a large problem; since a noise that is superimposed on the amplitude signal tends to appear at the output of an amplitude modulation section during a state when the amplitude modulation section is in a saturational motion.

Therefore, as a countermeasure to this problem, a circuit configuration in which a bandpass filter is inserted in an output section of an amplitude modulation section is suggested in Japanese Laid-Open Patent Publication No. 2003-143060 (patent document 1). This configuration allows cutting noises that leak from a circuit related to transmission, to a circuit related to reception via a duplexer. However, with the configuration described in this patent document 1, a main signal also passes through the bandpass filter, which results in a loss of the main signal.

SUMMARY OF THE INVENTION

Therefore, an objective of the present invention is to provide: a transmitter that can achieve both reduction of a reception band noise generated at an amplitude amplification section and suppression of a modulation distortion without causing a loss of a main signal; and a communication apparatus that uses the transmitter.

An objective of the present invention is directed toward a transmitter that generates and outputs a transmission signal based on inputted data. In order to achieve the above described objective, the transmitter of present invention includes: a signal generating section; an angle modulation section; an amplitude amplification section; a low pass filter section; and an amplitude modulation section.

The signal generating section generates an amplitude signal and a frequency signal, based on an amplitude component and a phase component, which are obtained by conducting a signal processing on the data. The angle modulation section conducts an angle modulation on the frequency signal. The amplitude amplification section outputs a signal in accordance with a magnitude of the amplitude signal. The low pass filter section attenuates a radio frequency component included in an output signal from the amplitude amplification section; and outputs this attenuated signal. The amplitude modulation section is inputted with an output signal from the angle modulation section, and conducts an amplitude modulation on the output signal by using an output signal from the low pass filter section, and then outputs the resulting signal as a modulation signal.

Typically, the amplitude amplification section is a regulator. Furthermore, the low pass filter section includes: an inductor inserted and connected in series between the amplitude amplification section and the amplitude modulation section; and a capacitor that grounds an output side of the inductor.

Preferably, the amplitude amplification section includes a plurality of amplitude amplifiers which respectively output signals in accordance with the magnitude of the amplitude signal; the low pass filter section includes a plurality of low pass filters which are provided so as to correspond to the plurality of amplitude amplifiers, and which attenuate radio frequency components of output signals from the corresponding amplitude amplifiers; and the amplitude modulation section includes a plurality of amplitude modulators which are provided so as to correspond to the plurality of low pass filters, and which are connected in series, wherein each amplitude modulator among the plurality of amplitude modulators conducts an amplitude modulation on an input signal and outputs the resulting signal, by using an output signal from a corresponding low pass filter among the plurality of low pass filters. Furthermore preferably the above described configuration further includes a delay adjusting section which is interposed between the signal generating section and at least one of the plurality of amplitude amplifiers, and which adjusts an amount of delay that is generated in between the plurality of low pass filters.

In addition, preferably, further included is a controlling section that changes an amount of attenuation of a predefined radio frequency component in the low pass filter section in accordance with at least one selected from the following: a modulation method of the data, a modulation condition of the data, a reception band, an output power of the modulation signal, and a frequency of the modulation signal. This controlling section may adjust the amount of delay at the delay adjusting section in accordance with at lease one selected from the following: the modulation method of the data; the modulation condition of the data; the reception band; the output power of the modulation signal; and the frequency of the modulation signal.

Furthermore, the present invention is also directed toward a communication apparatus that includes the transmitter described above. The communication apparatus includes: any one of the transmitter above which generates a transmission signal; an antenna that outputs the transmission signal generated by the transmitter; a receiver that processes a reception signal received from the antenna; and an antenna duplexer which outputs the transmission signal generated by the transmitter to the antenna, and which outputs the reception signal received from the antenna to the receiver.

According to the present invention described above, both reduction of a reception band noise generated at an amplitude amplification section and suppression of a modulation distortion can be achieved, without causing a loss of a main signal.

These and other objectives, features, aspects and advantages of the present invention will be further revealed by the following detailed description in reference to the attached figures.

BRIEF DESCRIPTION OF THE DRAWINGS

FIG. 4 shows one example of a look-up table included in a controlling section 60;

FIG. 7 shows one example of a look-up table included in a controlling section 65;

DESCRIPTION OF THE PREFERRED EMBODIMENTS

First Embodiment

Figure 1:
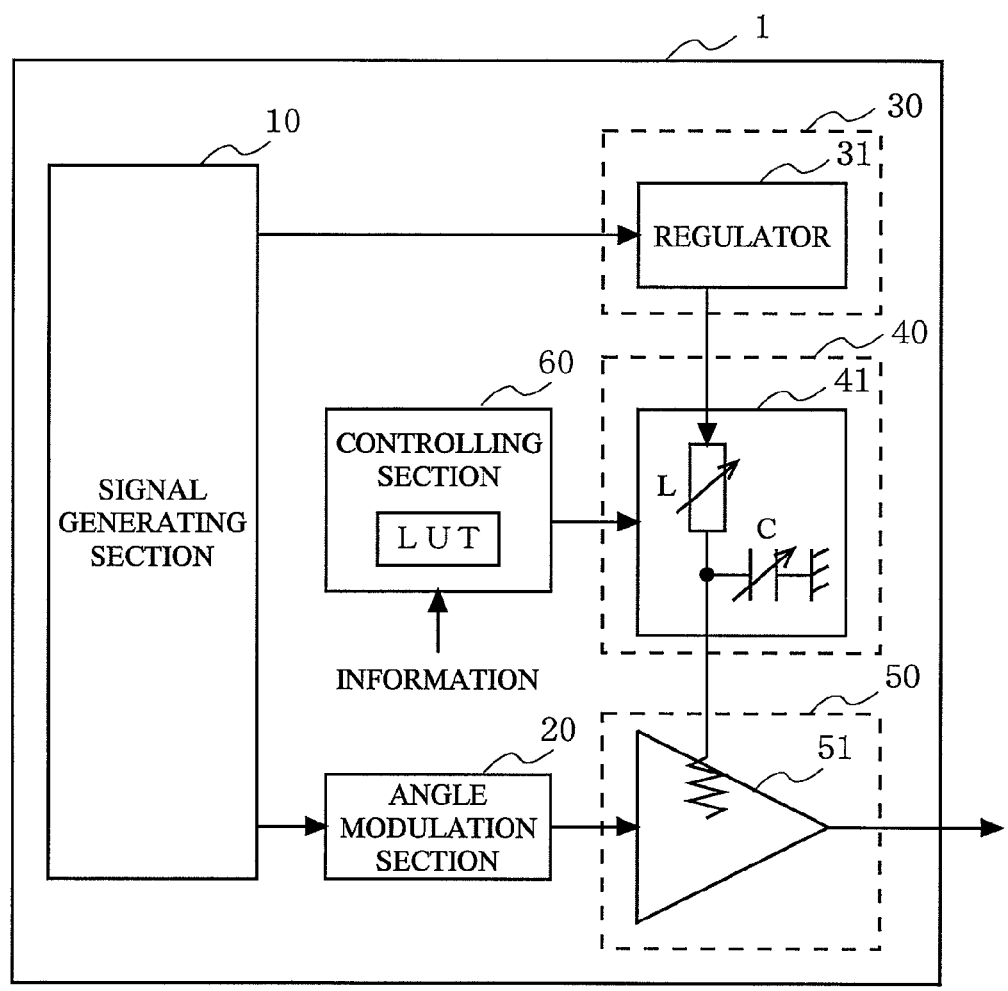
FIG. 1 shows a configuration of a transmitter 1 according to a first embodiment of the present invention.

FIG. 1 shows a configuration of a transmitter 1 according to a first embodiment of the present invention. In FIG. 1, the transmitter 1 according to the first embodiment of the present invention includes: a signal generating section 10; an angle modulation section 20; an amplitude amplification section 30 that includes an amplitude amplifier 31; a low pass filter section 40 that includes a low pass filter (LPF) 41; an amplitude modulation section 50 that includes a power amplifier 51; and a controlling section 60.

The signal generating section 10 outputs an amplitude signal and a frequency signal, based on an amplitude component and a phase component, which are obtained by conducting a signal processing on inputted data. The frequency signal is signal obtained by performing differentiation on the phase with respect to time. The amplitude signal is inputted into the amplitude amplifier 31. The amplitude amplifier 31 typically includes a regulator, and this regulator 31 outputs a signal that is proportional to a magnitude of the inputted amplitude signal. The signal outputted from the regulator 31 passes through the low pass filter 41, resulting in an attenuation of a radio frequency component of the signal; and is inputted to a power supply terminal of the power amplifier 51.

Typically, the low pass filter 41 includes: a variable inductor L that is inserted in between the regulator 31 and the power amplifier 51 (an input impedance of a collector of an amplification transistor) in series; and a variable capacitor C that grounds an output side of the variable inductor L.

The frequency signal is inputted into the angle modulation section 20, and an angle modulation is conducted on the frequency signal. The frequency signal, on which the angle modulation is conducted, is inputted to a signal input terminal of the power amplifier 51 included in the amplitude modulation section 50. The power amplifier 51 conducts an amplitude modulation on the signal outputted from the angle modulation section 20 by using the signal inputted to the power supply terminal; and outputs a modulation signal, which is modulated here, as a transmission signal.

The controlling section 60 controls an amount of attenuation of the radio frequency component at the low pass filter 41 based on information such as: a modulation method and a modulation condition of the data inputted into the signal generating section 10; a reception band; an output power and a frequency of the modulation signal; and the like. More specifically, the controlling section 60 changes: a value of either the variable inductor L or the variable capacitor C; or both values of the variable inductor L and the variable capacitor C. The information described here is provided from an external source (e.g. a base station).

Discussed next is a case where the transmitter 1 is applied in a mobile phone, where "UMTS" and "GSM" are used as wireless communication methods; and for example, "Band II" and "Band V" exists within the bands of the UMTS in this case.

Figure 2:
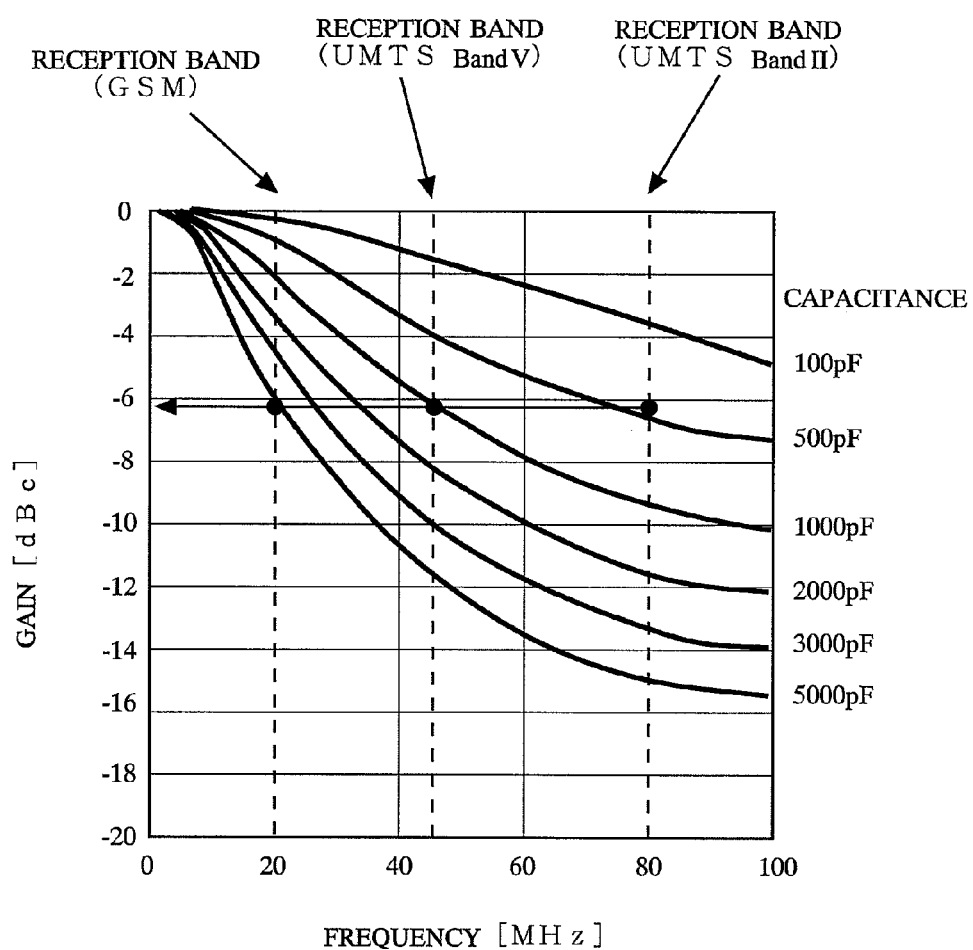
FIG. 2 shows one example of frequency gain characteristics in wireless communication.
Figure 3:
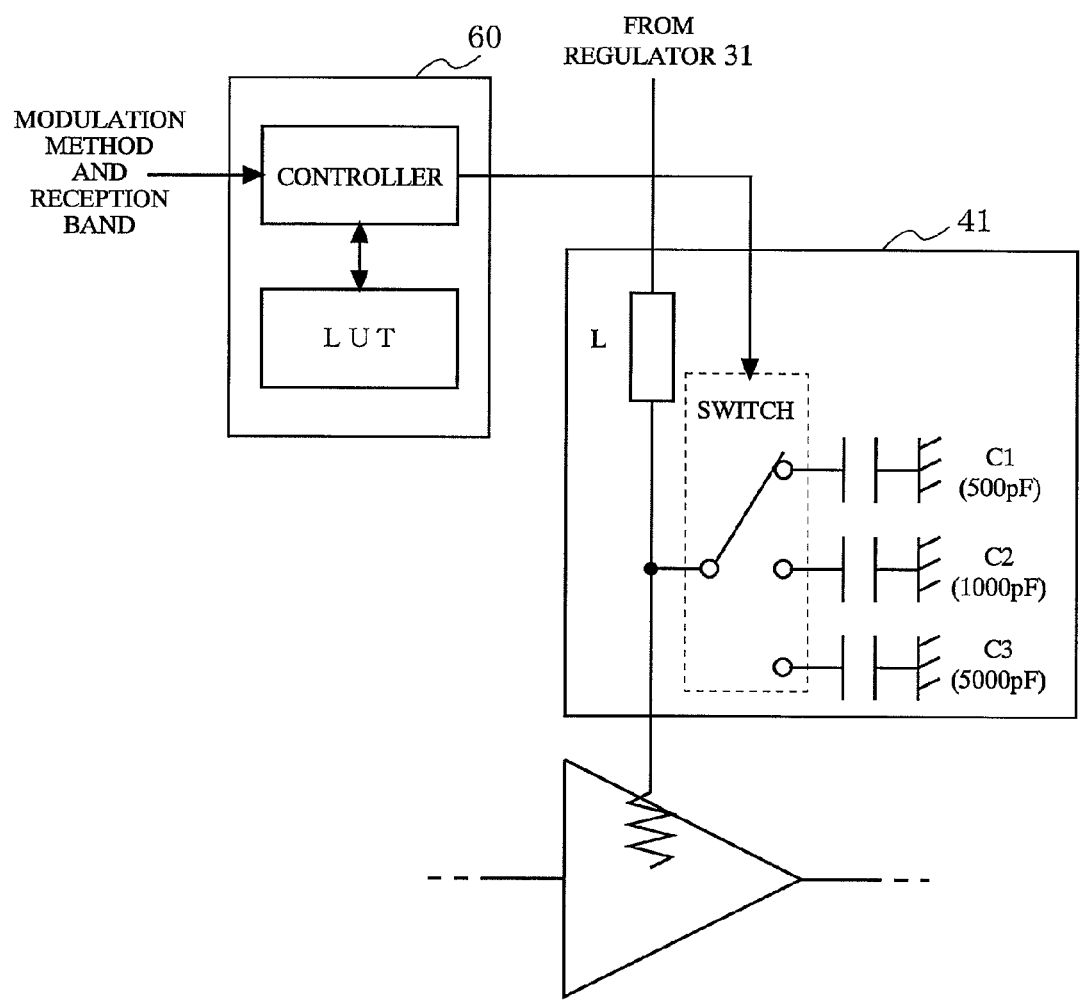
FIG. 3 shows one example of a detailed configuration of low pass filters 41 and 42.

In this case, if a level of a noise outputted from the regulator 31 is desired to be suppressed in a reception band for approximately 6 dB, the variable capacitor C is configured with a design shown in FIG. 3 in accordance with frequency gain characteristics shown in FIG. 2.

At the time of actual use, the controlling section 60 conducts a control by selecting: a capacitor C1 (500 pF) by using a switch when operating in UMTS (Band II); a capacitor C2 (1000 pF) by using the switch when operating in UMTS (Band V); and a capacitor C3 (5000 pF) by using the switch when operating in a GSM signal.

A frequency of the reception band is defined by an offset frequency determined with regard to a transmission frequency; and for example, is 80 MHz in UMTS (Band II), 45 MHz in UMTS (Band V), and 20 MHz in GSM. Therefore, a frequency that should be suppressed at the output of the regulator 31 differs depending on the wireless communication method. Meanwhile, an amplitude signal band differs between GSM and UMTS; and is 2 MHz in GSM, approximately 30 MHz in UMTS (Band II), and approximately 20 MHz in UMTS (Band V).

Here, it may be seen as a favorable option to select the capacitor C3 (5000 pF) used in GSM also for UMTS. However, even though a sufficient suppression amount can be secured at the reception band, the amplitude signal band necessary for obtaining a cutoff frequency (−3 dB attenuation) of a filter cannot be secured, thus resulting in a larger modulation distortion. Therefore, the capacitor C2 (1000 pF) is selected in UMTS (Band V) in order to allow securing 20 MHz as the cutoff frequency (−3 dB attenuation) of the filter, while securing an amount of noise suppression of 6 dB or more in 45 MHz which is the reception band. Furthermore, the capacitor C1 (500 pF) is selected in UMTS (Band II) in order to allow securing 30 MHz which is the amplitude signal band necessary for the cutoff frequency (−3 dB attenuation) of the filter, while securing an amount of noise suppression of 6 dB or more in 80 MHz which is the reception band.

Furthermore, information regarding which capacitor is best suited for which modulation method (GSM or UMTS) and which reception band (Band II or Band V), may be kept in advance in a look-up table (LUT) and the like; and the controlling section 60 may appropriately select the capacitor depending on the modulation method and the reception band. FIG. 4 shows one example of a look-up table included in the controlling section 60.

As described above, with the transmitter 1 according to the first embodiment of the present invention, the amount of attenuation of each component within signals outputted from the signal generating section 10 and the amplitude amplification section 30 are controlled by using the controlling section 60 and the low pass filter section 40. As a result, reduction of a reception band noise generated at the amplitude amplification section 30, and suppression of a modulation distortion can both be achieved.

Figure 5:
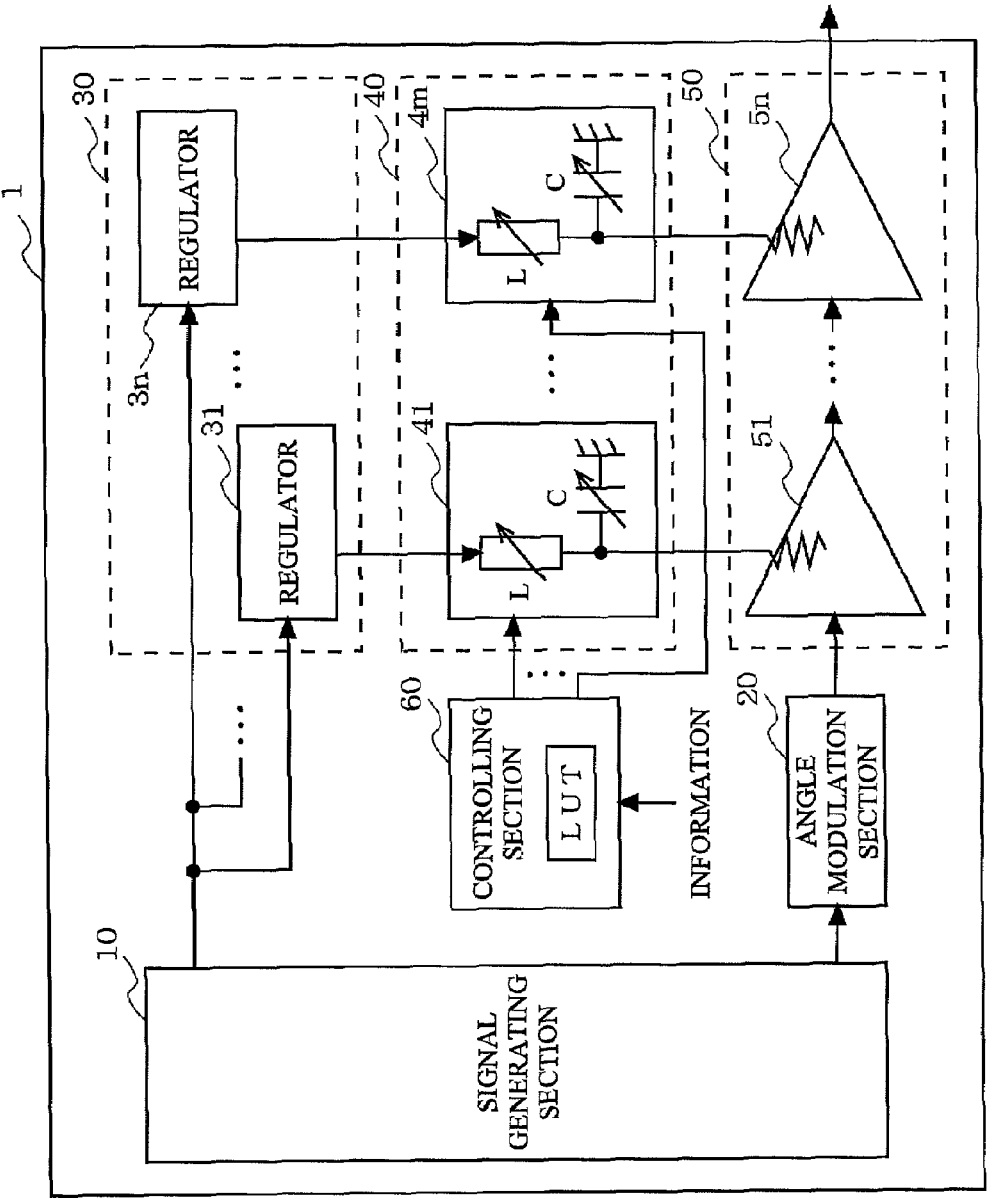
FIG. 5 shows a configuration of another transmitter 1' according to the first embodiment of the present invention.

Furthermore, in the first embodiment described above, the transmitter 1 includes one of each for the regulator 31, the low pass filter 41 and the power amplifier 51; however, as shown in FIG. 5, these configurations can also be applicable to a transmitter 1' that conducts amplification in multiple stages. In this case, values of capacitors selected by a plurality of low pass filters 41 to 4m (m is an integer) do not necessary have to be all identical; and some or all of them may be different from each other. Still further, the low pass filters 41 to 4m may not all be inserted in between, a plurality of regulators 31 to 3n (n is an integer), and a plurality of power amplifiers 51 to 5n.

Second Embodiment

Generation of a delay between signals inputted in each of the power amplifiers is expected when the transmitter that uses the multistage amplification described above is attained. Thus a transmitter capable of adjusting the generated delay is described in a second embodiment here. Although one example of a transmitter that uses a two-stage power amplifier will be described in the following; the present invention is also applicable to a transmitter that uses a power amplifier which has three or more stages.

Figure 6:
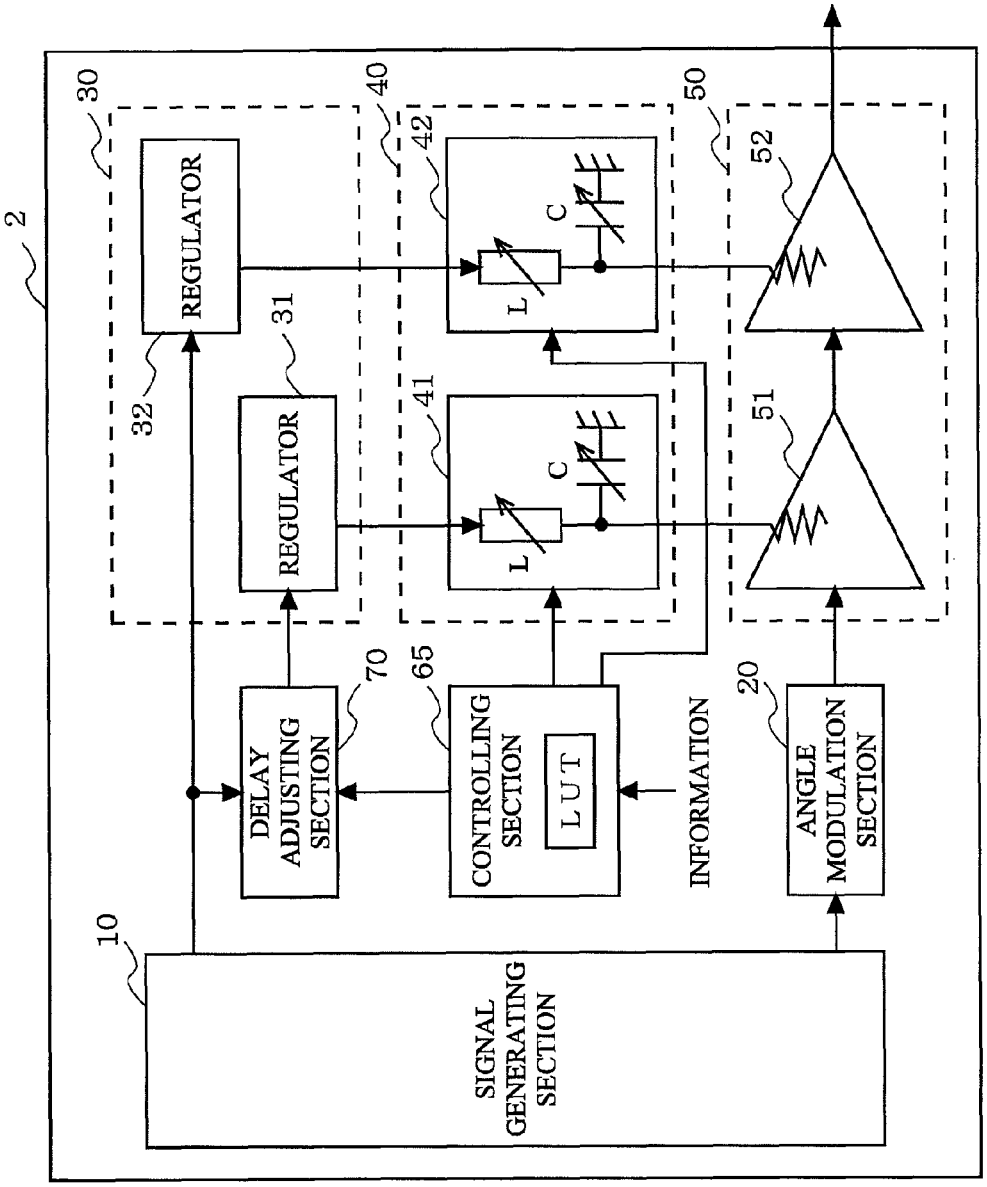
FIG. 6 shows a configuration of a transmitter 2 according to a second embodiment of the present invention.

FIG. 6 shows a configuration of a transmitter 2 according to the second embodiment of the present invention. In FIG. 6, the transmitter 2 according to the second embodiment of the present invention includes: the signal generating section 10; the angle modulation section 20; the amplitude amplification section 30; the low pass filter section 40; the amplitude modulation section 50; a controlling section 65; and a delay adjusting section 70. The transmitter 2 according to the second embodiment and the transmitter 1 according to the first embodiment described above are identical except for the controlling section 65 and the delay adjusting section 70. Since other configurations of the transmitter 2 are identical to the configurations of the transmitter 1; these other configurations are denoted with the same reference characters, and descriptions of those are omitted.

The delay adjusting section 70 is provided in between the regulator 31 and the signal generating section 10, or in between a regulator 32 and the signal generating section 10. In the example in FIG. 6, the delay adjusting section 70 is provided in between the regulator 31 and the signal generating section 10. This delay adjusting section 70 is provided in order to largely match a timing at a main signal band (band close to DC) of a signal, which is outputted to the power amplifier 51 after the radio frequency component of the signal has been attenuated by the low pass filter 41, and a signal, which is outputted from a power amplifier 52 after a radio frequency component of the signal has been attenuated by a low pass filter 42.

In addition to controls of amounts of attenuation of radio frequency components at the low pass filters 41 and 42, based on, the modulation method and the modulation condition of the data inputted into the signal generating section 10 described above, the reception band, the output power and the frequency of the modulation signal; the controlling section 65 further controls a signal delay amount at the delay adjusting section 70. Furthermore, information regarding the degree of adjustment necessary for the signal delay amount with the modulation method (GSM or UMTS) and the reception band (Band II or Band V), may be kept in advance in a look-up table (LUT) and the like; and the controlling section 65 may appropriately select the degree of adjustment depending on the modulation method and the reception band. FIG. 7 shows one example of a look-up table included in the controlling section 65.

As described above, with the transmitter 2 according to the second embodiment of the present invention, the amount of attenuation of the radio frequency component within the signal outputted from the amplitude amplification section 30, and the signal delay amount at the low pass filter section 40, are controlled by using the controlling section 65, the low pass filter section 40, and the delay adjusting section 70. As a result, the timing at the main signal band (band close to DC) of signals outputted respectively from the low pass filter 41 and 42 can be largely matched. Therefore, reduction of the reception band noise generated at the amplitude amplification section 30, and suppression of the modulation distortion can both be achieved with further efficiency, without degrading a modulation characteristic of the modulation signal outputted from the amplitude modulation section 50.

The regulator 31 and 32 described above in the first and the second embodiments may be configured only from series regulators, or may be configured by combining switching regulators and series regulators.

<Communication Apparatus Using the Transmitter of the Present Invention>

Figure 8:
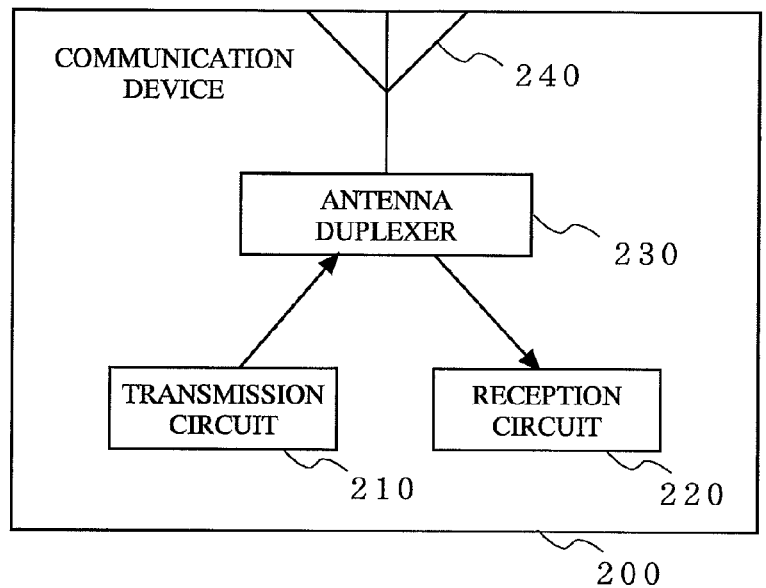
FIG. 8 shows a configuration of a communication apparatus 200 according to one embodiment of the present invention.
Figure 9:
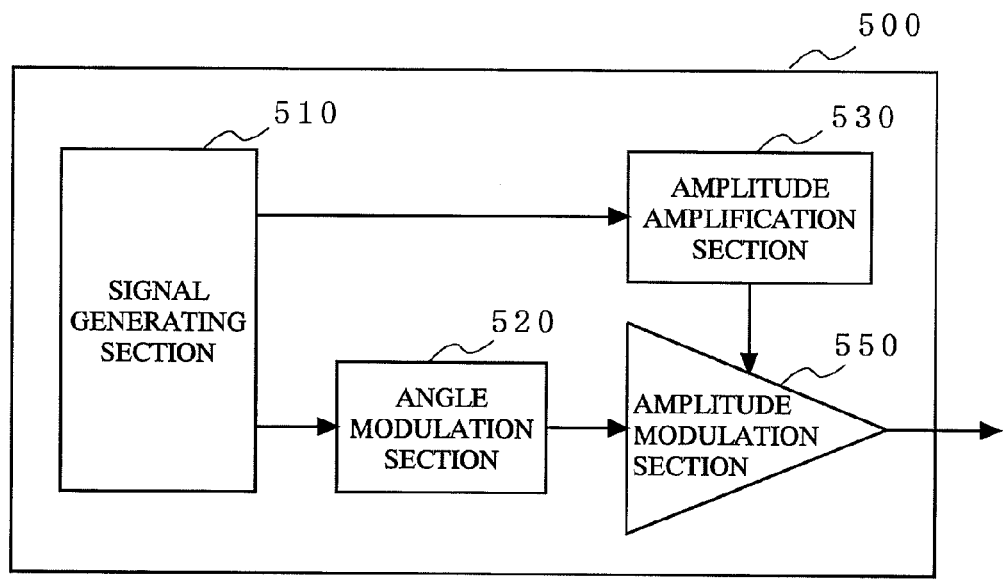
FIG. 9 shows a configuration example of a conventional transmitter 500.

FIG. 8 shows a configuration example of a communication apparatus 200 according to one embodiment of the present invention. In FIG. 8, the communication apparatus 200 includes: a transmitter 210; a receiver 220; an antenna duplexer 230; and an antenna 240. The transmitter 210 is the transmitter of the present invention described above. The antenna duplexer 230 transmits a transmission signal outputted from the transmitter 210 to the antenna 240, and prevents the transmission signal from leaking into the receiver 220. Additionally, the antenna duplexer 230 transmits a reception signal inputted from the antenna 240 into the receiver 220, and prevents the reception signal from leaking into the transmitter 210.

As a result, the transmission signal is outputted from the transmitter 210 and externally release from the antenna 240 via the antenna duplexer 230. The reception signal is received by the antenna 240 and then received by the receiver 220 via the antenna duplexer 230.

By using the transmitter of the present invention described above, this communication apparatus 200 can attain low distortion as a wireless apparatus while securing linearity of the transmission signal. Moreover, since the output of the transmitter 210 is not branched out to a directional coupler and the like, it is possible to reduce a loss that occurs in between the transmitter 210 and the antenna 240; which enables reduction in the power consumed at the time of transmission, allowing a prolonged usage time as a wireless communication apparatus. Furthermore, the communication apparatus 200 may have a configuration that only includes the transmitter 210 and the antenna 240.

While the invention has been described in detail, the foregoing description is in all aspects illustrative and not restrictive. It is understood that numerous other modifications and variations can be devised without departing from the scope of the invention.

What is claimed is:

1. A transmitter that generates and outputs a transmission signal based on inputted data, the transmitter comprising:
   a signal generating section that generates an amplitude signal and a frequency signal, based on an amplitude component and a phase component, which are obtained by performing signal processing on the inputted data;
   an angle modulation section that performs angle modulation on the generated frequency signal, so as to output an angle modulated signal;
   an amplitude amplification section that outputs an amplified signal in accordance with a magnitude of the generated amplitude signal;
   a low pass filter section which attenuates a radio frequency component included in the amplified signal output from the amplitude amplification section, so as to output an attenuated signal;
   an amplitude modulation section which receives the angle modulated signal output from the angle modulation section, and which performs amplitude modulation on the received angle modulated signal using the attenuated signal output from the low pass filter section, so as to output a modulation signal; and
   a controlling section that changes an amount of the attenuation performed on the radio frequency component by the low pass filter section in accordance with at least one of: (i) a modulation method of the inputted data; (ii) a modulation condition of the inputted data; (iii) a reception band; (iv) an output power of the modulation signal; and (v) a frequency of the modulation signal,
   wherein the low pass filter section includes: a variable inductor that is inserted between the amplitude amplification section and the amplitude modulation section in series; and a variable capacitor that grounds an output side of the variable inductor, and
   wherein the controlling section includes a pre-defined look-up table for selecting a most suitable capacitor value according to the modulation method of the inputted data and the reception band, and changes a value of at least the variable capacitor according to the look-up table, so as to change the amount of the attenuation performed on the radio frequency component by the low pass filter section.

2. The transmitter according to claim 1,
   wherein the amplitude amplification section comprises a plurality of amplitude amplifiers, such that each respective amplitude amplifier of the plurality of amplitude amplifiers outputs signals in accordance with the magnitude of the generated amplitude signal,
   wherein the low pass filter section comprises a plurality of low pass filters corresponding to the plurality of amplitude amplifiers, and attenuating radio frequency components of the signals output from the plurality of amplitude amplifiers, and
   wherein the amplitude modulation section comprises a plurality of amplitude modulators corresponding to the plurality of low pass filters, such that each respective amplitude modulator of the plurality of amplitude modulators is connected in series to a corresponding low pass filter of the plurality of low pass filters, and such that each amplitude modulator of the plurality of amplitude modulators performs an amplitude modulation on an input signal and outputs a resulting signal using an output signal from a corresponding low pass filter of the plurality of low pass filters.

3. The transmitter according to claim 1, wherein the amplitude amplification section is a regulator.

4. A communication apparatus comprising:
   the transmitter according to claim 1 which generates the transmission signal;
   an antenna that outputs the transmission signal generated by the transmitter;
   a receiver that processes a reception signal received from the antenna; and
   an antenna duplexer which outputs the transmission signal generated by the transmitter to the antenna, and which outputs the reception signal received from the antenna to the receiver.

5. The transmitter according to claim 2, further comprising a delay adjusting section interposed between the signal generating section and at least one amplitude amplifier of the plurality of amplitude amplifiers, and adjusting an amount of delay generated between the low pass filters of the plurality of low pass filters.

6. The transmitter according to claim 5, wherein the controlling section adjusts the amount of delay at the delay adjusting section in accordance with at least one of: (i) the modulation method of the inputted data; (ii) the modulation condition of the inputted data; (iii) the reception band; (iv) the output power of the modulation signal; and (v) the frequency of the modulation signal.

* * * * *